(12) United States Patent
Kim et al.

(10) Patent No.: US 7,514,954 B2
(45) Date of Patent: Apr. 7, 2009

(54) METHOD AND APPARATUS FOR OUTPUT DRIVER CALIBRATION

(75) Inventors: Kang Yong Kim, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 260 days.

(21) Appl. No.: 11/432,421

(22) Filed: May 10, 2006

(65) Prior Publication Data
US 2007/0263459 A1   Nov. 15, 2007

(51) Int. Cl.
H03K 17/16   (2006.01)
H03K 19/003   (2006.01)
G11C 7/00   (2006.01)

(52) U.S. Cl. .................... 326/30; 365/189.11
(58) Field of Classification Search .................. 326/30, 326/86, 87, 68; 327/108, 109; 365/189.05, 365/189.11
See application file for complete search history.

(56) References Cited

U.S. PATENT DOCUMENTS

| | | | |
|---|---|---|---|
| 6,262,625 B1 | 7/2001 | Perner et al. | |
| 6,807,650 B2 | 10/2004 | Lamb et al. | |
| 6,836,143 B2 * | 12/2004 | Song | 326/30 |
| 6,839,286 B2 * | 1/2005 | Cho et al. | 365/189.05 |
| 6,947,336 B2 | 9/2005 | Kim et al. | |
| 6,958,613 B2 | 10/2005 | Braun et al. | |
| 2002/0063576 A1 * | 5/2002 | Kim et al. | 326/30 |
| 2003/0218914 A1 | 11/2003 | Kim et al. | |
| 2007/0040573 A1 | 2/2007 | Batt | |
| 2007/0200591 A1 * | 8/2007 | Kim | 326/30 |

* cited by examiner

Primary Examiner—Rexford Barnie
Assistant Examiner—Dylan White
(74) Attorney, Agent, or Firm—TraskBritt (57) ABSTRACT

An output driver calibration circuit determines calibration values for configuring adjustable impedance output drivers. Output drivers are calibrated by generating a first variable count in response to comparing a reference voltage to a first voltage at a calibration terminal when an external load is connected. A first pull-up impedance circuit is varied in response to a first variable count and varying an impedance in a second variable pull-up impedance circuit in response to the first variable count. A second variable count is generated responsive to comparing the reference voltage to a second voltage at a reference node between the second variable pull-up impedance circuit and is serially connected to a variable pull-down impedance circuit. The impedance to the variable pull-down impedance circuit is varied in response to the second variable count. The first and second variable counts for configuring the output drivers are output when a steady state is achieved.

22 Claims, 9 Drawing Sheets

METHOD AND APPARATUS FOR OUTPUT DRIVER CALIBRATION

BACKGROUND OF THE INVENTION

1. Field of the Invention

The present invention is directed generally to semiconductor devices and, more particularly, to memory devices which include high resolution trimable output drivers.

2. State of the Art

Semiconductor devices such as microcomputers, memories, gate arrays, among others, include input/output pins and an output circuit for transmitting data to other devices along transmission lines formed on a board, and the like. A circuit within the semiconductor device that is responsible for transmitting data includes, for example, output buffers and drivers. For optimum transmission, the impedance of the transmitting device should be matched to the impedance of the transmission network and receiving device.

As operational speeds of electronic devices increase, the swing of transmitted signals decreases. However, as the signal swing width of a transmitted signal decreases, external noise increases. External noise can affect the reflection characteristics of an output signal if there is any impedance mismatch at an interface. Impedance mismatches may be caused by external noise, noise on a supply voltage, temperature and process variations, as well as other variations. If an impedance mismatch arises, the transmission speed of the data decreases, and the data from a semiconductor device may become distorted. Thus, in a case where a semiconductor device receives distorted data, problems can be caused by setup/hold failures or errors in reading received data.

Integrated circuits typically include a number of input/output terminals or pins which are used for communication with additional circuitry. For example, an integrated memory device such as a dynamic random access memory (DRAM) includes both control inputs for receiving memory operation control signals, and data pins for bidirectional data communication with an external system or processor. The data transmission rate of conventional integrated circuits is primarily limited by internal circuitry operating speeds. That is, communication networks have been developed which can transmit signals between circuitry at a rate that is faster than the capacity of many integrated circuits.

To address the need for faster circuits, a group of integrated circuits can be combined on a common bus. In this configuration, each integrated circuit operates in a coordinated manner with the other integrated circuits to share data which is transmitted at a high speed. For example, a group of memory devices, such as DRAMs, static RAMs, or read only memories (ROMs), can be connected to a common data bus. The data rate of the bus may be substantially faster than the feasible operating speed of the individual memories. Each memory, therefore, is operated so that while one memory is processing received data, another memory is receiving new data. By providing an appropriate number of memory devices and an efficient control system, very high speed data transmissions can be achieved.

In order to reduce the effects of impedance mismatches, techniques for more tightly matching the output driver impedance with the characteristic impedance of the remaining circuit within which the output driver interacts are desirable. Manufacturing process control during fabrication of the integrated circuit that includes an output driver is one method for controlling the output impedance of the output driver. However, as transmission data rates increase, impedance matching of the output driver to the characteristic impedance using conventional processing controls is inadequate.

For the reasons stated above, and for other reasons stated below which will become apparent to those skilled in the art upon reading and understanding the present specification, there is a need in the art for a high speed output driver circuit wherein the impedance may be more precisely adjusted.

BRIEF SUMMARY OF THE INVENTION

The present invention includes methods, circuits and systems for calibrating an impedance of an adjustable output driver. In one embodiment of the present invention, an output driver calibration circuit includes a pull-up calibration circuit and a pull-down calibration circuit. The pull-up calibration circuit includes a first comparator configured to compare a reference voltage to a first voltage at a calibration terminal when an external load is connected thereto. The pull-up calibration circuit further includes a first counter configured to generate a first variable count in response to the comparator. The pull-up calibration circuit further includes a first variable pull-up impedance circuit responsive to the first variable count where the first variable pull-up impedance coupled to the calibration terminal. The pull-down calibration circuit includes a second variable pull-up impedance circuit concurrently responsive to the first variable count and a variable pull-down impedance circuit serially coupled at a reference node to the second variable pull-up impedance circuit. The pull-down calibration circuit further includes a second comparator configured to compare the reference voltage to a second voltage at the reference node and a second counter configured to generate a second variable count in response to the second comparator with the variable pull-down impedance circuit being responsive to the second variable count.

In another embodiment of the present invention, a memory device includes a memory array and at least one adjustable output driver coupled between the memory array and at least one interface terminal. The memory device further includes an output driver calibration circuit configured to adjust an impedance of the at least one adjustable output driver. The output driver calibration circuit includes a pull-up calibration circuit and a pull-down calibration circuit. The pull-up calibration circuit includes a first comparator configured to compare a reference voltage to a first voltage at a calibration terminal when an external load is connected thereto. The pull-up calibration circuit further includes a first counter configured to generate a first variable count in response to the comparator and a first variable pull-up impedance circuit responsive to the first variable count. The pull-down calibration circuit includes a second variable pull-up impedance circuit concurrently responsive to the first variable count and a variable pull-down impedance circuit serially coupled at a reference node to the second variable pull-up impedance circuit. The pull-down calibration circuit further includes a second comparator configured to compare the reference voltage to a second voltage at the reference node and a second counter configured to generate a second variable count in response to the second comparator with the variable pull-down impedance circuit being responsive to the second variable count.

In a further embodiment of the present invention, a semiconductor wafer includes a plurality of integrated circuit memory devices with each memory device including a memory array and at least one adjustable output driver coupled between the memory array and at least one interface terminal. The memory device further includes an output driver calibration circuit configured to adjust an impedance of the at least one adjustable output driver. The output driver calibration circuit includes a pull-up calibration circuit and a pull-down calibration circuit. The pull-up calibration circuit includes a first comparator configured to compare a reference voltage to a first voltage at a calibration terminal when an external load is connected thereto. The pull-up calibration circuit further includes a first counter configured to generate a first variable count in response to the comparator and a first variable pull-up impedance circuit responsive to the first variable count. The pull-down calibration circuit includes a second variable pull-up impedance circuit concurrently responsive to the first variable count and a variable pull-down impedance circuit serially coupled at a reference node to the second variable pull-up impedance circuit. The pull-down calibration circuit further includes a second comparator configured to compare the reference voltage to a second voltage at the reference node and a second counter configured to generate a second variable count in response to the second comparator with the variable pull-down impedance circuit being responsive to the second variable count.

In yet another embodiment of the present invention, an electronic system includes a processor and at least one of an input device and an output device operably coupled to the processor. The electronic system further includes a memory device including a memory array, at least one adjustable output driver coupled between the memory array and at least one interface terminal. The memory device further includes an output driver calibration circuit configured to adjust an impedance of the at least one adjustable output driver. The output driver calibration circuit includes a pull-up calibration circuit and a pull-down calibration circuit. The pull-up calibration circuit includes a first comparator configured to compare a reference voltage to a first voltage at a calibration terminal when an external load is connected thereto. The pull-up calibration circuit further includes a first counter configured to generate a first variable count in response to the comparator and a first variable pull-up impedance circuit responsive to the first variable count. The pull-down calibration circuit includes a second variable pull-up impedance circuit concurrently responsive to the first variable count and a variable pull-down impedance circuit serially coupled at a reference node to the second variable pull-up impedance circuit. The pull-down calibration circuit further includes a second comparator configured to compare the reference voltage to a second voltage at the reference node and a second counter configured to generate a second variable count in response to the second comparator with the variable pull-down impedance circuit being responsive to the second variable count.

In a yet further embodiment of the present invention, a method for calibrating an impedance of an adjustable output driver is provided. A first variable count is generated in response to comparing a reference voltage to a first voltage at a calibration terminal when an external load is connected thereto. An impedance is varied in a first variable pull-up impedance circuit in response to the first variable count. An impedance is concurrently varied in a second variable pull-up impedance circuit in response to the first variable count. A second variable count is generated in response to comparing the reference voltage to a second voltage at a reference node between the second variable pull-up impedance circuit and a serially connected variable pull-down impedance circuit. An impedance of the variable pull-down impedance circuit is varied in response to the second variable count. The first variable count is output for configuring an output driver when the first variable count achieves a steady state and the second variable count is output for further configuring the output driver when the first and the second variable counts achieve steady states.

In yet a further embodiment of the present invention, an output driver calibration circuit includes a pull-up calibration circuit including a first comparator configured to compare a reference voltage to a first voltage at a calibration terminal when an external load is connected thereto. The pull-up calibration circuit further comprises a first reconfigurable counter configured to generate a first variable count in response to the comparator and a first variable pull-up impedance circuit responsive to the first variable count. The output driver calibration circuit further includes a pull-down calibration circuit including a second variable pull-up impedance circuit responsive to the first variable count and a variable pull-down impedance circuit serially coupled at a reference node to the second variable pull-up impedance circuit. The pull-down calibration circuit further includes a second comparator configured to compare the reference voltage to a second voltage at the reference node and a second reconfigurable counter configured to generate a second variable count in response to the second comparator with the variable pull-down impedance circuit being responsive to the second variable count.

In yet a further embodiment of the present invention, an output driver calibration circuit includes a pull-up calibration circuit and a pull-down calibration circuit. The pull-up calibration circuit includes a first comparator configured to compare a reference voltage to a first voltage at a calibration terminal when an external load is connected thereto. The pull-up calibration circuit further includes a first counter configured to generate a first variable count in response to the comparator and a first extended range variable pull-up impedance circuit responsive to the first variable count. The pull-down calibration circuit includes a second extended range variable pull-up impedance circuit responsive to the first variable count and a variable pull-down impedance circuit serially coupled at a reference node to the second variable pull-up impedance circuit. pull-down calibration circuit further includes a second comparator configured to compare the reference voltage to a second voltage at the reference node and a second counter configured to generate a second variable count in response to the second comparator. The variable pull-down impedance circuit is responsive to the second variable count with the first and second extended range variable pull-up impedance circuits having a greater impedance range than a variable pull-up impedance circuit in an output driver to be calibrated.

BRIEF DESCRIPTION OF THE SEVERAL VIEWS OF THE DRAWINGS

In the drawings, which illustrate what is currently considered to be the best mode for carrying out the invention.

DETAILED DESCRIPTION OF THE INVENTION

One method and apparatus for improving the output impedance of an output driver on an integrated circuit includes the ability to trim or otherwise adjust the output impedance following the processing and fabrication of the integrated circuit. In the various embodiments of the present invention, the output impedance of the output driver is adjusted or trimmed, for example, by adjusting the quantity of p-channel and n-channel field effect transistors (FETs) that are engaged when an adjustable output driver is configured.

Trimming or adjusting the output driver may occur at various stages of integration including, but not limited to, packaging of the integrated circuit device and integration into a higher assembly circuit or system. Furthermore, the execution of the trim or adjustment may occur upon external request or activation or may be configured to be internally activated on one or more occurrences. In one application, the various embodiments of the present invention find application to one or more design standards that may include calibration commands including, but not limited to, self or internal calibration of output drivers.

Figure 1:
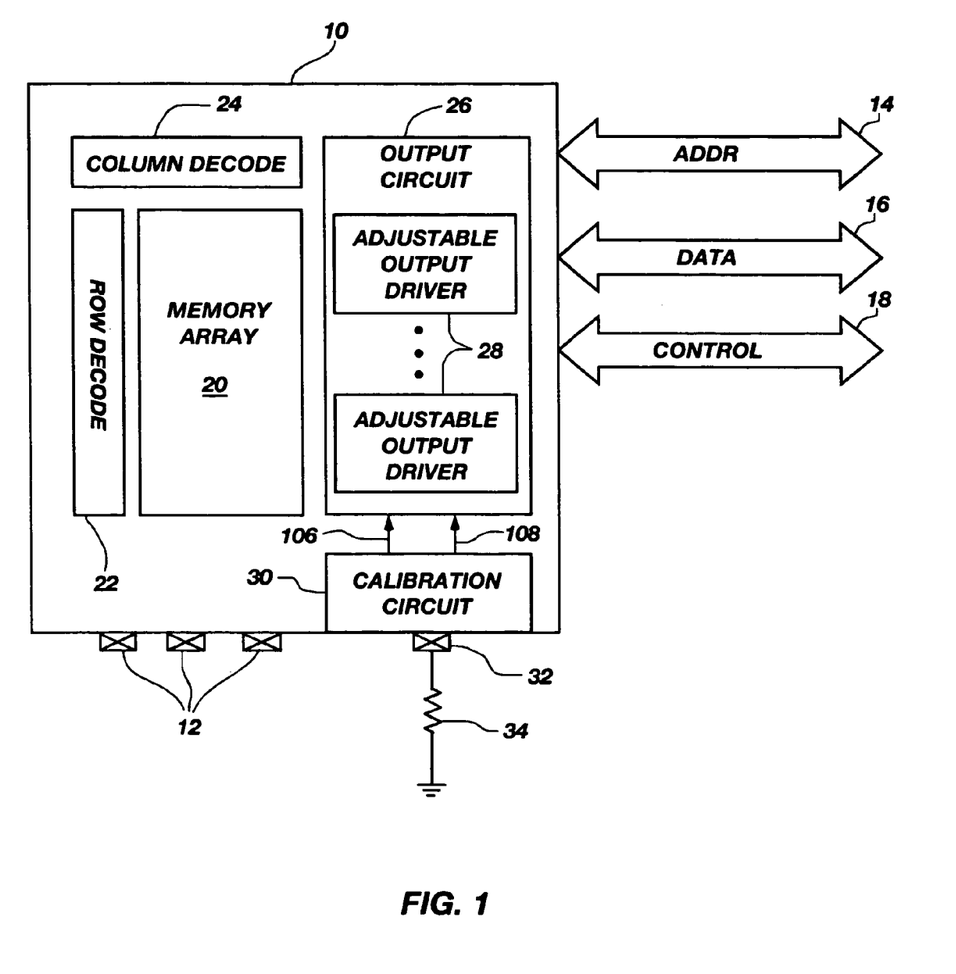
FIG. 1 is a block diagram of a memory device including an output driver calibration circuit, in accordance with an embodiment of the present invention.

FIG. 1 is a block diagram of a memory device including an output driver calibration circuit, in accordance with an embodiment of the present invention. A memory device 10 may be part of a DIMM (dual in-line memory module) or a PCB (printed circuit board) containing many such memory devices (not shown in FIG. 1). The memory device 10 may include a plurality of physical connection terminals or pins 12 located outside of memory device 10 for electrically connecting the memory device 10 into more integrated configurations such as memory modules or electronic systems. Various ones of pins 12 may couple to memory address bus 14, data (DQ) pins or data bus 16, and control pins or control bus 18. It is evident that each of the reference numerals 14, 16, 18 designates more than one pin in the corresponding bus. Further, it is understood that the diagram in FIG. 1 is for illustration only. That is, the pin arrangement or configuration in a typical memory device may not be in the form shown in FIG. 1.

In operation, a processor or memory controller (not shown) may communicate with the memory device 10 and perform memory read/write operations. The processor and the memory device 10 may communicate using address signals on the address bus 14, data signals on the data bus 16, and control signals (e.g., a row address strobe (RAS) signal, a column address strobe (CAS) signal, a chip select (CS) signal, etc. (not shown)) on the control bus 18. The "width" (i.e., number of pins) of address, data and control buses may differ from one memory configuration to another.

The memory device 10 may include a plurality of memory cells in a memory array 20 generally arranged in an array of rows and columns. A row decode circuit 22 and a column decode circuit 24 may select the rows and columns, respectively, in the memory array 20 in response to decoding an address provided on the address bus 14. Data to and from the memory cells of memory array 20 are then transferred over the data bus 16 via sense amplifiers (not shown) and a data output path (not shown). A memory controller (not shown) may provide relevant control signals (not shown) on the control bus 18 to control data communication to and from the memory device 10 via an Input/Output (I/O) circuit, the output portion of which is illustrated as output circuit 26. The output circuit 26 may include a number of data output buffers or output drivers to receive the data bits from the memory array 20 and to provide those data bits or data signals to the corresponding data lines in the data bus 16. In accordance with the various embodiments of the present invention, the output drivers are illustrated as adjustable output drivers 28.

The memory device 10 also includes an output driver calibration circuit 30 constructed according to the various embodiments of the present invention. The output driver calibration circuit 30 further includes a calibration terminal or pad 32 utilized for trimming or adjusting the output impedance of the adjustable output drivers 28 of the output circuit 26. An external load such as an external calibration resistor 34 is connectable to the calibration pad 32 and is used to control the output impedance of the memory device 10 as described below.

Those of ordinary skill in the art will readily recognize that memory device 10 of FIG. 1 is simplified to illustrate one embodiment of a memory device. FIG. 1 is not intended to be a detailed illustration of all of the elements and features of a typical memory device and various elements of a memory device are not illustrated for clarity in understanding the various embodiments of the present invention.

Figure 2:
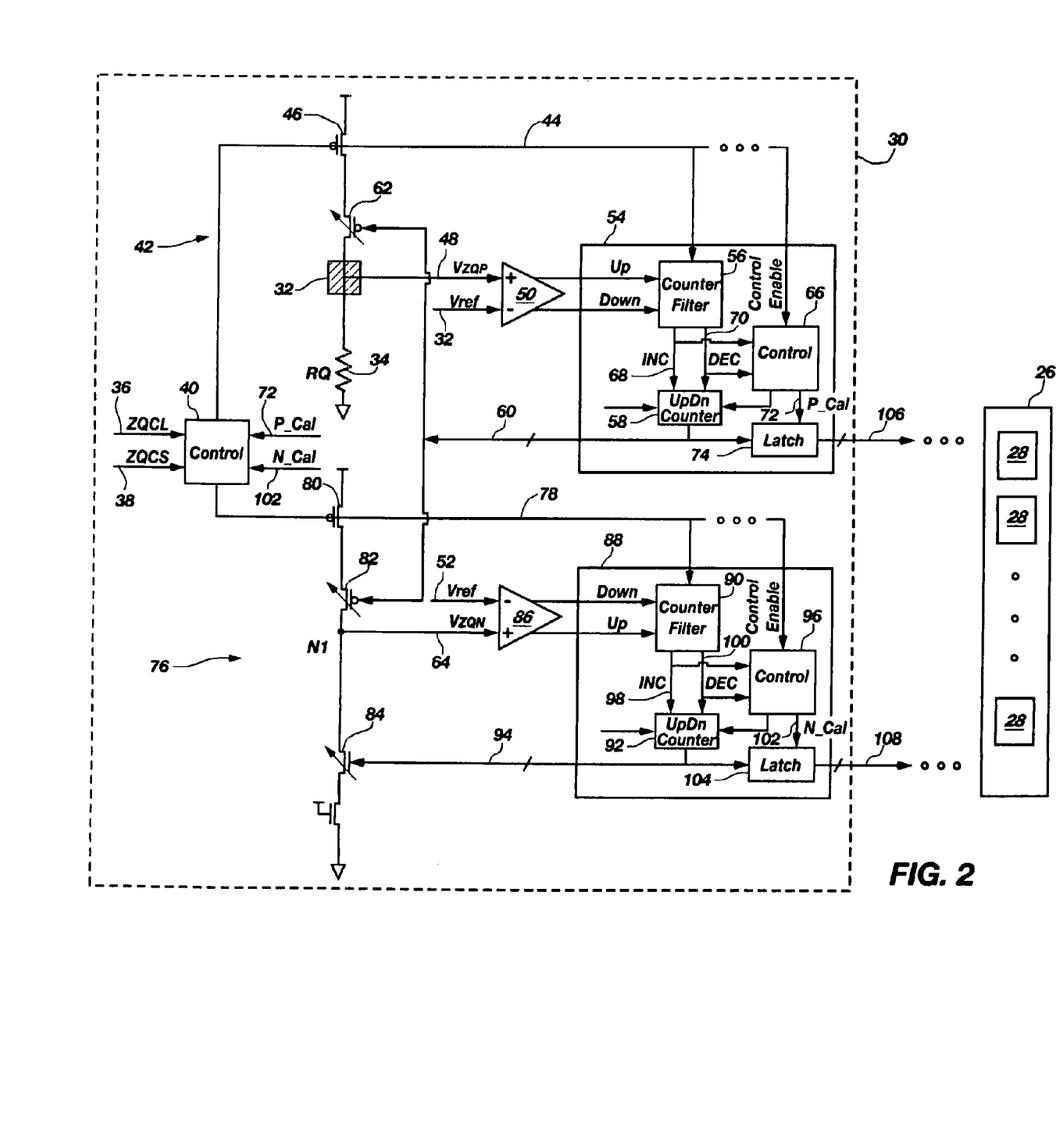
FIG. 2 is block diagram of an output driver calibration circuit, in accordance with an embodiment of the present invention.

FIG. 2 is block diagram of an output driver calibration circuit, in accordance with an embodiment of the present invention. The output driver calibration circuit 30 is configured to provide output driver impedance control for obtaining a desired output impedance value irrespective of power supply voltage, temperature, and process variations. The various embodiments of the present invention describe an adjustable output driver circuit having a pull-up circuit or section comprised of pull-up transistors and a pull-down circuit or section comprised of pull-down transistors. The adjustable output drivers are configurable according to the calibration results of the output driver calibration circuit 30 when an external calibration resistor 34 is coupled to the calibration pad 32.

In FIG. 2, output driver calibration circuit 30 includes a calibration pad 32 to which an external calibration resistor 34 may be connected. In order to perform the output driver calibration method of the present invention, an external calibration resistor 34 is attached to calibration pad 32 to identify to the output driver circuit 30 the target or desired output driver impedance. In one embodiment of the present invention, a calibration command is received at the memory device 10 (FIG. 1) and is decoded into one or more specific calibration sequences. In FIG. 2, by way of illustration and not limitation, the calibration command may be a long calibration command ZQCL 36 or a short calibration command ZQCS 38 that directs calibration and control logic 40 to sequence the output driver calibration method.

In response to a calibration command, the p-channel or pull-up calibration circuit portion 42 of the output driver calibration circuit 30 is activated to determine the pull-up configuration of the adjustable output driver that best approximates the desired output driver impedance. A p-channel calibration enable signal 44 activates p-channel FET 46 and enables or resets other elements within a pull-up portion 42 of the calibration circuit 30. The value of the voltage $V_{ZQP}$ 48 at the calibration pad 32 is input to a comparator 50 along with a reference voltage $V_{REF}$ 52 produced by a reference generator (not shown). The comparator 50 is of the type which produces up and down pulses in response to the difference in magnitude between the values of reference voltage $V_{REF}$ 52 and the voltage $V_{ZQP}$ 48. The up and down pulses from comparator 50 are coupled to a p-channel calibration logic 54 which includes a counter filter 56 for accumulating and filtering the up and down pulses prior to being input into an up-down counter 58. The up-down counter 58 produces a multi-bit, variable p-channel count signal 60 representing a count value which is responsive to the number of up and down pulses which have been counted. The p-channel count signal 60 is input to a pull-up or p-channel variable impedance circuit 62. The variable impedance circuit 62 is shown in detail in FIG. 3A.

Figure 3A:
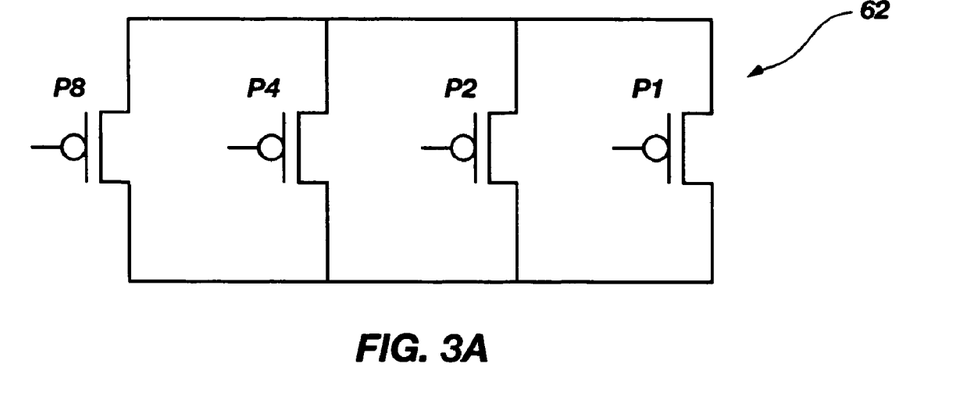
FIGS. 3A and 3B are examples of pull-up and pull-down variable impedance circuits, in accordance with an embodiment of the present invention.

By way of example and not limitation, the variable impedance circuit 62 in FIG. 3A is comprised of four p-channel FETs arranged in a parallel configuration. The gate of each of the FETs is controlled by one of the bits of the variable p-channel count signal (FIG. 2) from up-down counter 58. Furthermore, each FET is configured as being, for example, twice the size, i.e., has twice the drive of a previous FET. Thus, FET P2 is twice the size of FET P1, FET P4 is twice the size of FET P2, and FET P8 is twice the size of FET P4.

Figure 4:
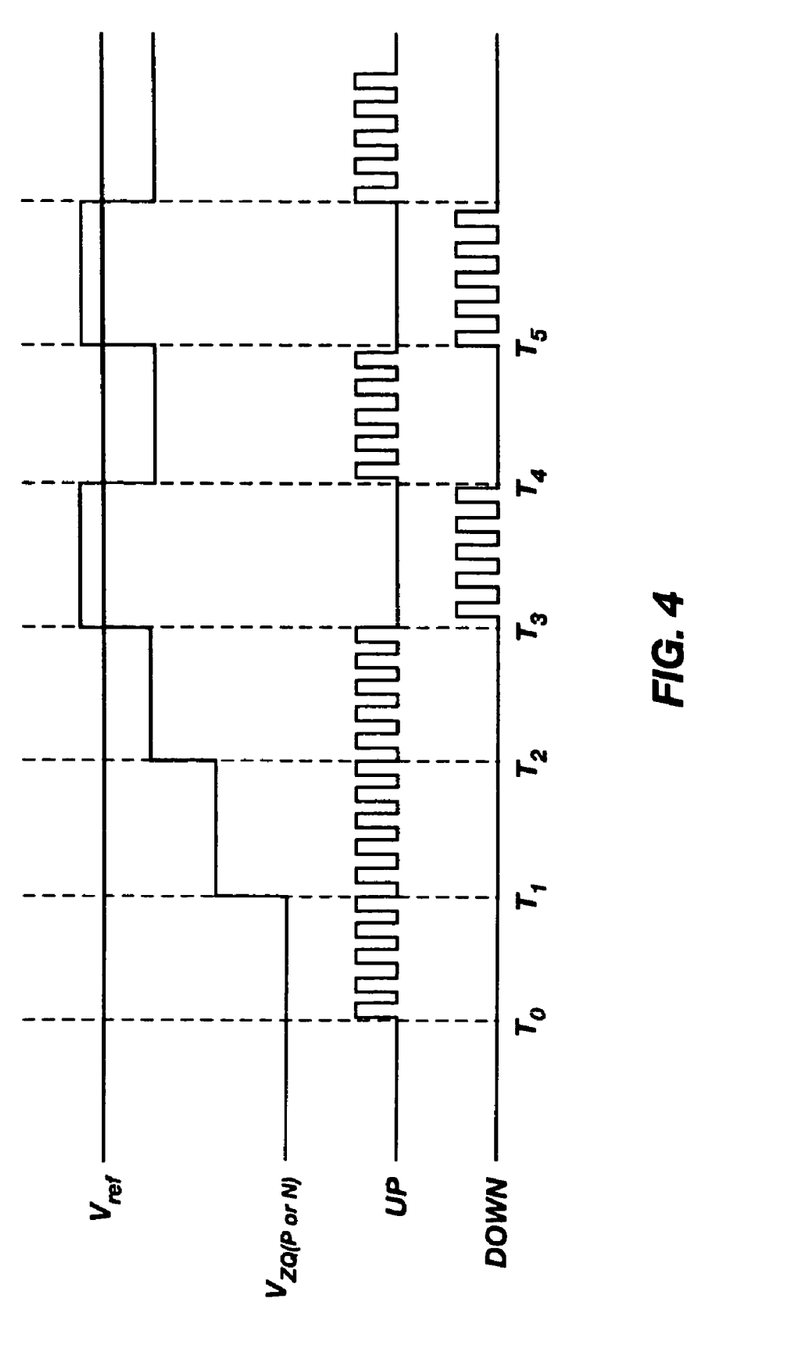
FIG. 4 is a timing diagram illustrating a comparison process of pull-up and pull-down variable impedance circuits for calibrating output drivers, in accordance with an embodiment of the present invention.

FIG. 4 is a timing diagram illustrating a comparison process of p-channel and n-channel variable impedance circuits for calibrating output drivers in accordance with one or more of the various embodiments of the present invention. In FIG. 4, the voltage $V_{REF}$ is compared to the voltage $V_{ZQ}$ which in FIG. 4 represents $V_{ZQP}$ 48 (FIG. 2) for the calibration of the p-channel FETs and also represents $V_{ZQN}$ 64 (FIG. 2) for the calibration of the n-channel FETs. In FIG. 4 at time $T_0$, the voltage $V_{ZQP}$ is less than the voltage $V_{REF}$ such that a plurality of up pulses is produced by comparator 50 (FIG. 2). At time $T_1$, a sufficient number of up pulses has been produced and accumulated by counter filter 56 (FIG. 2) causing the up-down counter 58 (FIG. 2) to change the value of the variable p-channel count signal 60 resulting in a change in activation of p-channel FETs in p-channel variable impedance circuit 62. For example, FET P1 may be turned off and FET P2 may be turned on, thereby increasing the value of voltage $V_{ZQP}$ by one increment. At time $T_2$, the voltage $V_{ZQP}$ is still less than the voltage $V_{REF}$ and, due to the continued counting of the up pulses, the value of the voltage $V_{ZQP}$ is increased by the another step (e.g., FET P1 is turned on while FET P2 remains on).

At time $T_3$, the value of $V_{ZQP}$ is increased by another step and now the value of $V_{ZQP}$ exceeds the value of $V_{REF}$. The value of $V_{ZQP}$ is recognized as greater than value of voltage $V_{REF}$ so that the up-down counter 58 (FIG. 2) begins to receive down pulses from the comparator 50 (FIG. 2) for the period shown in FIG. 4 from time $T_3$ to time $T_4$. As a result, the value of the variable p-channel count signal 60 is returned to the value of that signal at time $T_2$ such that the voltage $V_{ZQP}$ is reduced by one step as shown at time $T_4$.

While a pattern may develop in which the value of $V_{ZQP}$ is increased by a step for one time period, e.g., time $T_5$ to time $T_6$, and is then reduced by one step, control logic 66 (FIG. 2) monitors counter increment signal 68 and counter decrement signal 70 and asserts a pull-up or p-channel calibrated signal 72 when the up-down counter 58 reaches a steady state. In response to the p-channel calibrated signal 72, the count of the variable p-channel count signal 60 can be locked by a latch 74 at either the value which produces the overshoot as shown from time $T_3$ to time $T_4$ or the value which produces a value for the voltage $V_{ZQP}$ as seen in the time period $T_4$ to $T_5$.

Figure 3B:
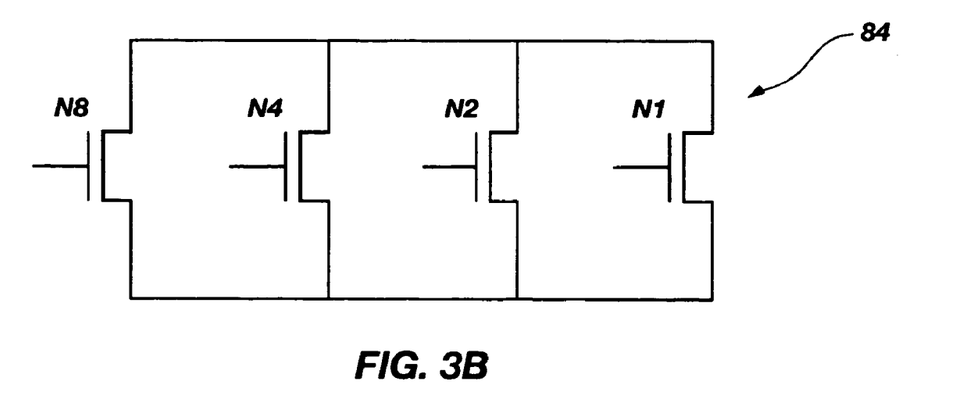

After the value for the variable p-channel count signal 60 has been locked, a similar process is carried out for an n-channel or pull-down calibration circuit portion 76 which is comprised of a plurality of n-channel MOS transistors as shown in FIG. 2 and FIG. 3B. Once the p-channel or pull-up portion 42 of the output driver calibration circuit 30 has been calibrated, an n-channel or pull-down portion 76 is also calibrated. While the p-channel or pull-up portion 42 of the output driver calibration circuit 30 was calculated with reference to the external calibration resistor 34, the n-channel or pull-down portion 76 is calibrated with respect to the recently calibrated p-channel or pull-up portion 42 of the output driver calibration circuit 30. Accordingly, an n-channel calibration enable signal 78 from control logic 40 activates p-channel FET 80 while now-latched variable p-channel count signal 60 also couples to a replica of the p-channel variable impedance circuit 62, the replica illustrated in FIG. 2 as a pull-up or p-channel variable impedance circuit 82.

A pull-down or n-channel variable impedance circuit 84 is connected in series at a reference node N1 with the p-channel variable impedance circuit 82 which is generally the same circuit as the variable impedance circuit 62. The reference voltage $V_{REF}$ 52 and a voltage $V_{ZQN}$ 64 available at a node between the p-channel variable impedance circuit 82 and the n-channel variable impedance circuit 84 are input to a comparator 86. The comparator 86 is of the type which produces up and down pulses in response to the difference in magnitude between the values of reference voltage $V_{REF}$ 52 and the voltage $V_{ZQN}$ 64. The up and down pulses from comparator 86 are coupled to an n-channel calibration logic 88 which includes a counter filter 90 for accumulating and filtering the up and down pulses prior to being input into an up-down counter 92. The up-down counter 92 produces a multi-bit, variable n-channel count signal 94 representing a count value which is responsive to the number of up and down pulses which have been counted. The n-channel count signal 94 is input to the n-channel variable impedance circuit 84. The n-channel variable impedance circuit 84 is shown in detail in FIG. 3B.

By way of example and not limitation, the n-channel variable impedance circuit 84 in FIG. 3B is comprised of four n-channel FETs arranged in a parallel configuration. The gate of each of the FETs is controlled by one of the bits of the variable n-channel count signal 94 (FIG. 2) from up-down counter 92. Furthermore, each FET is configured as being, for example, twice the size, i.e., has twice the drive of a previous FET. Thus, FET N2 is twice the size of FET N1, FET N4 is twice the size of FET N2, and FET N8 is twice the size of FET N4.

The comparison process for the n-channel or pull-down portion 76 is consistent with the description above as corresponding with FIG. 4. Namely, the voltage $V_{REF}$ is compared to the voltage $V_{ZQ}$ which in the present reference to FIG. 4 represents $V_{ZQN}$ 64 (FIG. 2) for the calibration of the n-channel FETs. As described above with reference to FIG. 4, at time $T_0$, the voltage $V_{ZQN}$ is less than the voltage $V_{REF}$ such that a plurality of up pulses is produced by comparator 86 (FIG. 2). At time $T_1$, a sufficient number of up pulses has been produced and accumulated by counter filter 90 (FIG. 2) causing the up-down counter 92 (FIG. 2) to change the value of the variable n-channel count signal 94 resulting in a change in activation of n-channel FETs in n-channel variable impedance circuit 84. For example, FET N1 may be turned off and FET N2 may be turned on, thereby increasing the value of voltage $V_{ZQN}$ by one increment. At time $T_2$, the voltage $V_{ZQN}$ is still less than the voltage $V_{REF}$ and, due to the continued counting of the up pulses, the value of the voltage $V_{ZQN}$ is increased by another step (e.g., FET N1 is turned on while FET N2 remains on).

At time $T_3$, the value of $V_{ZQN}$ is increased by another step and now the value of $V_{ZQN}$ exceeds the value of $V_{REF}$. The value of $V_{ZQN}$ is recognized as greater than the value of voltage $V_{REF}$ so that the up-down counter 92 (FIG. 2) begins to receive down pulses from the comparator 86 (FIG. 2) for the period shown in FIG. 4 from time $T_3$ to time $T_4$. As a result, the value of the variable n-channel count signal 94 is returned to the value of that signal at time $T_2$ such that the voltage $V_{ZQN}$ is reduced by one step as shown at time $T_4$.

While a pattern may develop in which the value of $V_{ZQN}$ is increased by a step for one time period, e.g., time $T_5$ to time $T_6$, and is then reduced by one step, control logic 96 monitors counter increment signal 98 and counter decrement signal 100 and asserts a pull-down or n-channel calibrated signal 102 when the up-down counter 92 reaches a steady state. In response to the n-channel calibrated signal 102, the count of the variable n-channel count signal 94 can be locked by a latch 104 at either the value which produces the overshoot as shown from time $T_3$ to time $T_4$ or the value which produces a value for the voltage $V_{ZQN}$ as seen in the time period $T_4$ to $T_5$.

Once the p-channel count signal 60 and the n-channel count signal 94 are latched by latch 74 and latch 104, respectively, the corresponding channel count signals are output as output driver calibrated p-channel count signal 106 and output driver calibrated n-channel count signal 108. Output driver calibrated p-channel count signal 106 and output driver calibrated n-channel count signal 108 are then forwarded to output circuit 26 for specifically configuring each of the adjustable output drivers 28 to more closely correspond with the desired output impedance.

Figure 5:
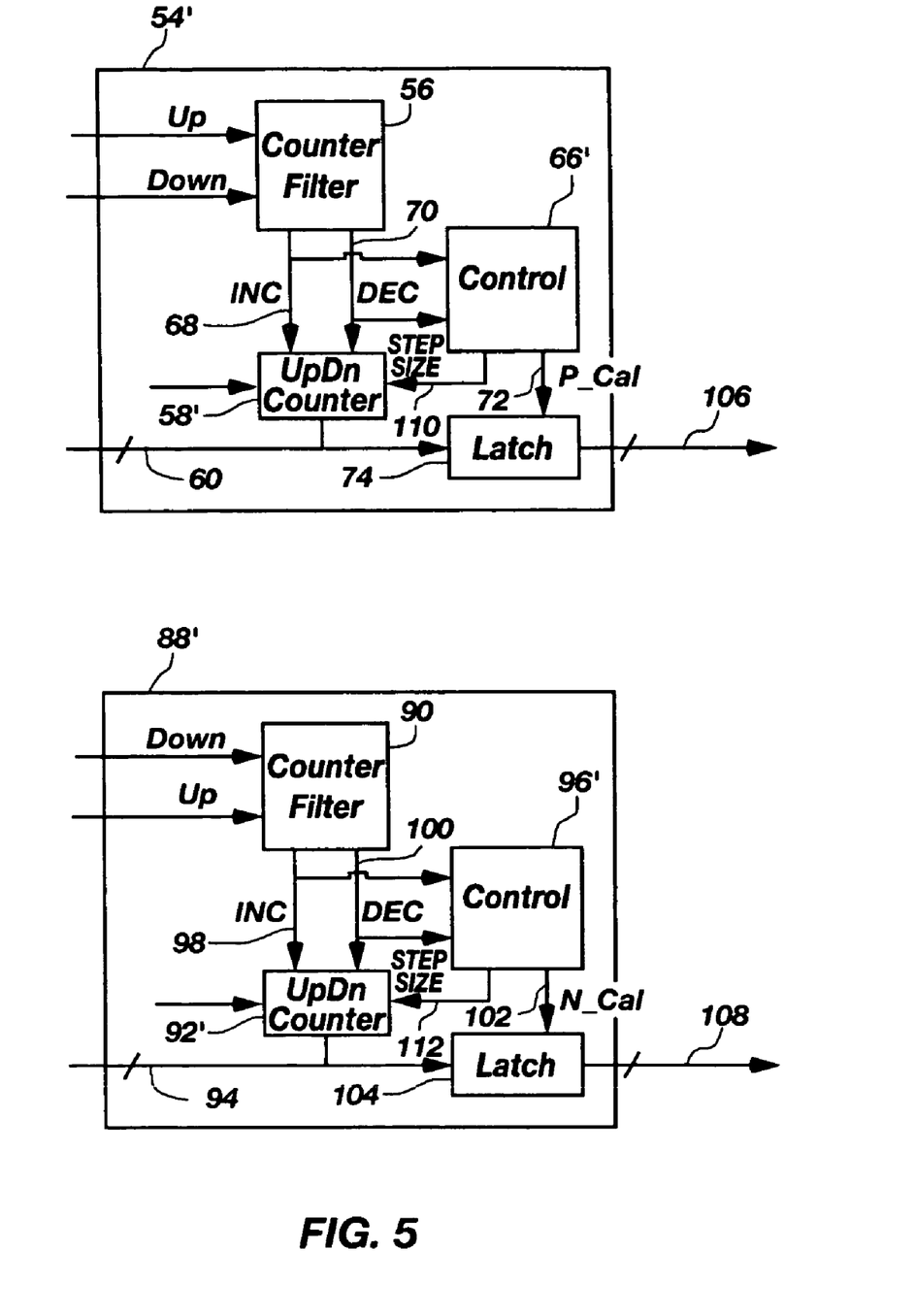
FIG. 5 is a block diagram of a portion of an output driver calibration circuit, in accordance with another embodiment of the present invention.

FIG. 5 is a block diagram of an output driver calibration circuit, in accordance with another embodiment of the present invention. The block diagram of the present embodiment is generally consistent with the block diagram of FIG. 2 but includes modifications as illustrated with respect to FIG. 5. In the present embodiment, control logic 66' in p-channel calibration logic 54' monitors counter increment signal 68 and counter decrement signal 70 and in response thereto, generates an increment/decrement step size signal 110 to a reconfigurable up-down counter 58'. Generally, when calibration begins, larger increment/decrement step sizes results in a faster arrival at the calibrated p-channel count signal 106. Control logic 66' monitors counter increment signal 68 and counter decrement signal 70 to determine the frequency of changes to the reconfigurable up-down counter 58'. When the requested changes occur at a higher frequency, then the step size of the increment/decrement step size signal 110 is increased. Accordingly, when the requested changes occur at a lower frequency, then the step size of the increment/decrement step size signal 110 is decreased.

Similarly, control logic 96' in n-channel calibration logic 88' monitors counter increment signal 98 and counter decrement signal 100 and in response thereto, generates an increment/decrement step size signal 112 to a reconfigurable up-down counter 92' to facilitate a faster arrival at the calibrated n-channel count signal 108. Control logic 96' monitors counter increment signal 98 and counter decrement signal 100 to determine the frequency of changes to the reconfigurable up-down counter 92'. When the requested changes occur at a higher frequency, then the step size of the increment/decrement step size signal 112 is increased. Accordingly, when the requested changes occur at a lower frequency, then the step size of the increment/decrement step size signal 112 is decreased.

Figure 6:
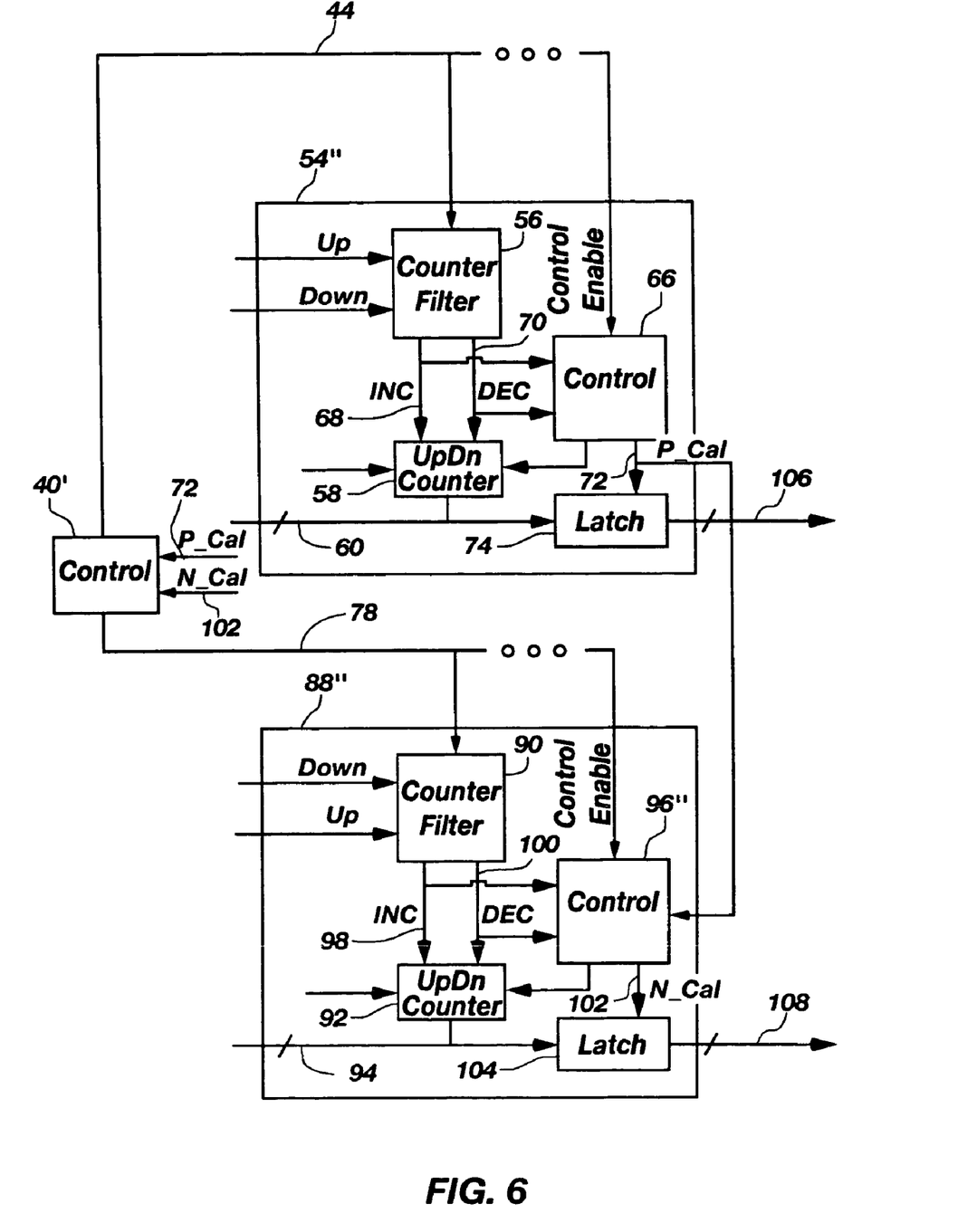
FIG. 6 is a block diagram of a portion of an output driver calibration circuit, in accordance with a further embodiment of the present invention.

FIG. 6 is a block diagram of an output driver calibration circuit, in accordance with a further embodiment of the present invention. The block diagram of the present embodiment is generally consistent with the block diagram of FIG. 2 but includes modifications as illustrated with respect to FIG. 6. In the present embodiment, control logic 40' simultaneously enables both the p-channel calibration logic 54" and the n-channel calibration logic 88" to reduce the calibration time. The p-channel FET 80 (FIG. 2) is simultaneously activated with the p-channel FET 46 (FIG. 2) allowing the near concurrent determination of calibrated p-channel count signal 106 and output driver calibrated n-channel count signal 108.

Specifically, in the present embodiment, since the variable p-channel count signal 60 continues to vary in the n-channel calibration logic 88" while the variable n-channel count signal 94 is being determined, the p-channel calibrated signal 72 is routed from control logic 40' to control logic 96" as a gating signal requiring the completion of the determination of p-channel calibrated signal 72 prior to the assertion of the n-channel calibrated signal 102 once the n-channel count signal 94 has reached a steady state. The present embodiment enables variable n-channel count signal 94 to immediately begin tracking variable p-channel count signal 60 resulting in a reduction of the calibration time.

Figure 7:
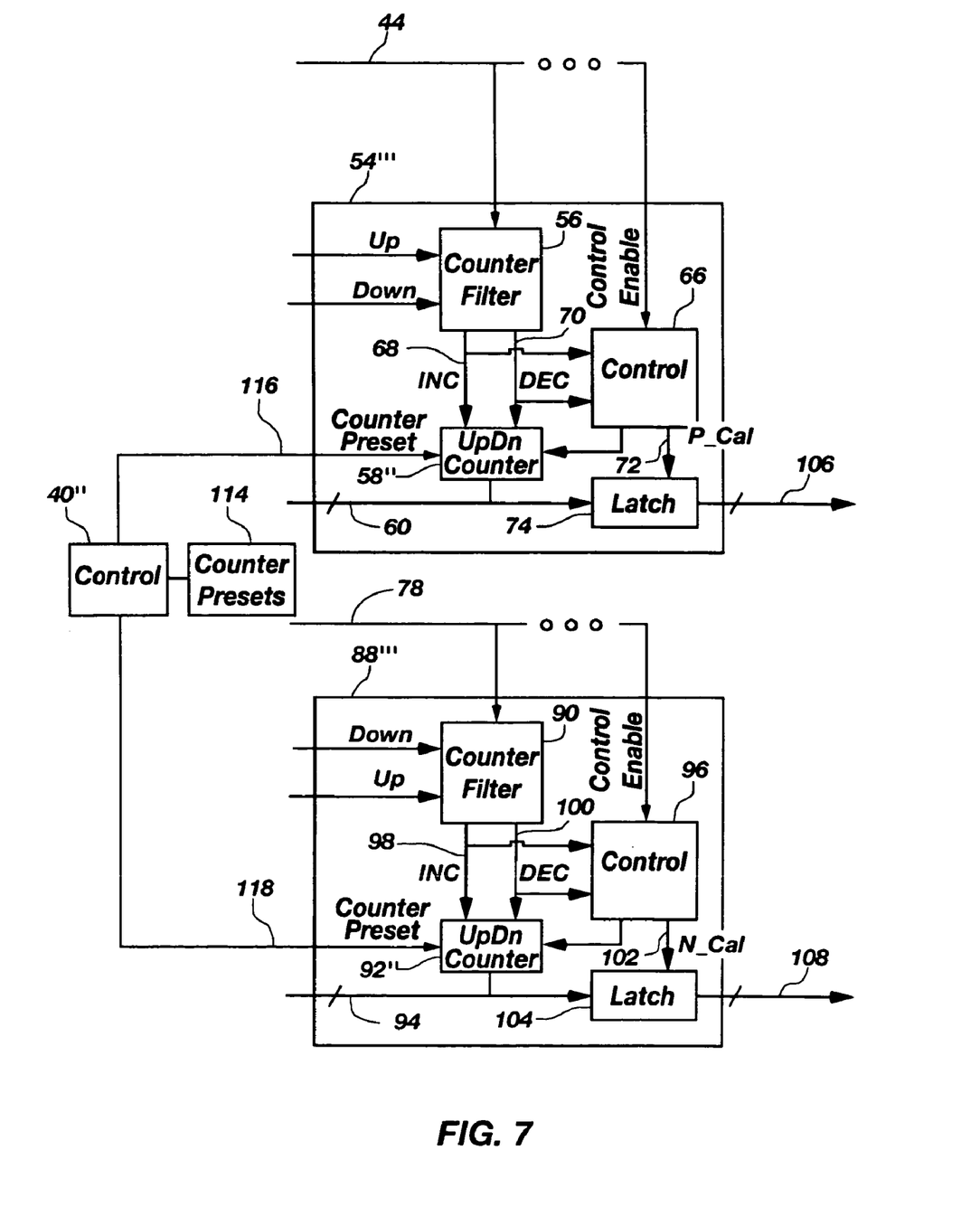
FIG. 7 is a block diagram of a portion of an output driver calibration circuit, in accordance with yet another embodiment of the present invention.

FIG. 7 is a block diagram of an output driver calibration circuit, in accordance with yet another embodiment of the present invention. The block diagram of the present embodiment is generally consistent with the block diagram of FIG. 2 but includes modifications as illustrated with respect to FIG. 7. In the present embodiment, control logic 40" presets initial counter preset values 114 as an initial starting value into a reconfigurable up-down counter 58" and a reconfigurable up-down counter 92" with counter preset value 116 and counter preset value 118, respectively. Presetting counters enables both the p-channel calibration logic 54''' and the n-channel calibration logic 88''' to reduce the calibration time by starting the reconfigurable up-down counters 58", 92" at count values that are a closer range or an approximation of the actual values. Determination of the approximate values may be a product of process parameters as determined by testing or otherwise for a specific production lot of memory devices. The preset values 114 may be stored via fuses, antifuses, or other non-volatile forms known by those of ordinary skill in the art.

Figure 8:
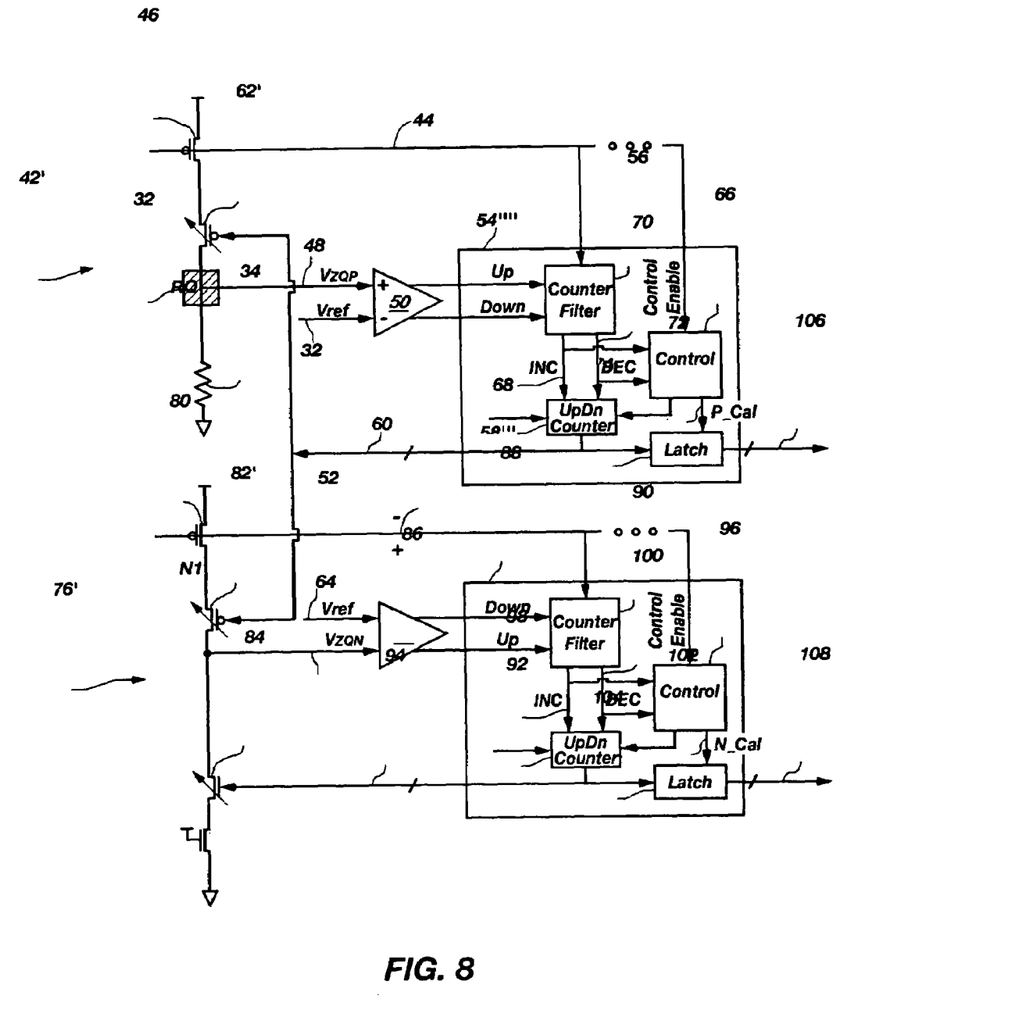
FIG. 8 is a block diagram of a portion of an output driver calibration circuit, in accordance with yet a further embodiment of the present invention.

FIG. 8 is a block diagram of an output driver calibration circuit, in accordance with yet a further embodiment of the present invention. The block diagram of the present embodiment is generally consistent with the block diagram of FIG. 2 but includes modifications as illustrated with respect to FIG. 8. The present embodiment appreciates processing corners wherein determination of output driver calibrated p-channel count signal 106 may reach the limits of the configurability of the adjustable output drivers 28 (FIG. 2) of the output circuit 26 (FIG. 2). However, in order to more accurately determine the output driver calibrated n-channel count signal 108, it would be desirable to extend the range of reconfigurable up-down counter 58''' beyond the range of the adjustable output driver 28 in order to enable a more precise calculation of the output driver calibrated n-channel count signal 108.

Specifically, the present embodiment includes an extended range up-down counter 58''' that provides for counting beyond the range of the adjustable output driver 28. A value corresponding to the maximum range of the adjustable output driver 28 is forwarded as the output driver calibrated p-channel count signal 106 for configuring the p-channel devices in the adjustable output drivers 28.

During calibration, the extended range up-down counter 58''' produces a multi-bit, extended range variable p-channel count signal 60' representing an extended count value which is responsive to the number of up and down pulses which have been counted. The p-channel count signal 60' is input to an extended range pull-up or p-channel variable impedance circuit 62'. Once the p-channel or pull-up portion 42' has been calibrated, the n-channel or pull-down portion 76' is also calibrated. Accordingly, an n-channel calibration enable signal 78 activates p-channel FET 46 while now-latched extended range variable p-channel count signal 60' also couples to a replica of the extended range p-channel variable impedance circuit 62', the replica illustrated in FIG. 8 as an extended range pull-up or p-channel variable impedance circuit 82'. An n-channel variable impedance circuit 84 is connected in series with the extended range p-channel variable impedance circuit 82' which is generally the same as the extended range variable impedance circuit 62'. The n-channel count signal 94 is determined based upon the extended range p-channel count signal 60' which reduces propagation of the error from the range limitation of the output driver calibrated p-channel count signal 106 from being propagated to the calculation of the output driver calibrated n-channel count signal 108. In another embodiment of the present invention, the range may be extended by changing the transistor sizes of p-channel FET 46 and p-channel FET 80 as opposed to extending the range of the p-channel variable impedance circuit 62' and p-channel variable impedance circuit 82'.

Figure 9:
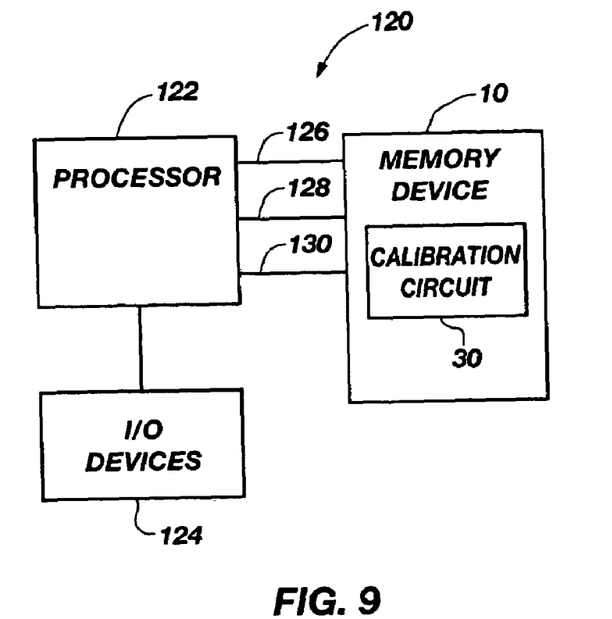
FIG. 9 is a block diagram of an electronic system including a memory device further including an output driver calibration circuit, in accordance with an embodiment of the present invention.

FIG. 9 is a block diagram of an electronic system including a memory device further including a calibration circuit, in accordance with an embodiment of the present invention. Electronic system 120 includes a processor 122, a memory device 10, and one or more I/O devices 124. Processor 122 may be a microprocessor, digital signal processor, embedded processor, microcontroller, or the like. Processor 122 and memory device 10 communicate using address signals on lines 126, control signals on lines 128, and data signals on lines 130. Memory device 10 includes a calibration circuit 30 for use in generation of output driver calibrated p-channel and n-channel count signals 106, 108 (FIG. 2).

Figure 10:
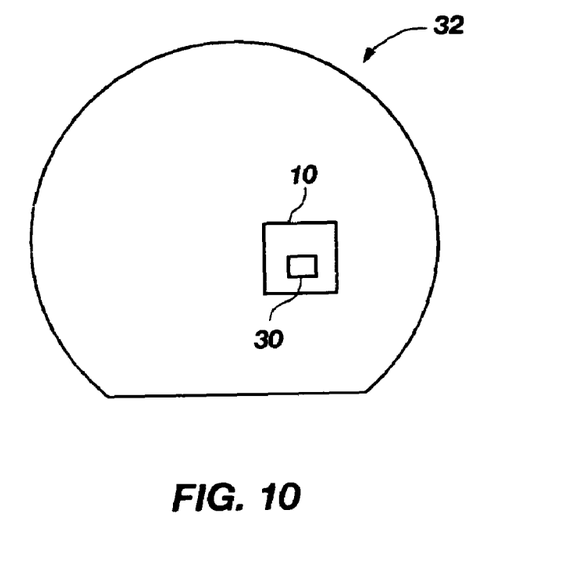
FIG. 10 illustrates a semiconductor wafer including one or more devices which further include adjustable output drivers and an output driver calibration circuit, in accordance with an embodiment of the present invention.

FIG. 10 illustrates a semiconductor wafer including one or more memory devices which further include a reference generator, in accordance with an embodiment of the present invention. A wafer 132, which includes multiple integrated circuits such as a memory device 10, at least one of which incorporates a calibration circuit 30, in accordance with one or more embodiments of the present invention. In one embodiment, the wafer includes a semiconductor substrate, such as a silicon, germanium, gallium arsenide or indium phosphide wafer. After processing the substrate to form the various circuit elements of the memory device 10, and any other circuit elements included in the integrated circuit, each integrated circuit such as memory device 10 may be singulated into individual semiconductor dice, packaged, and incorporated into an electronic system.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equivalents, rather than by the foregoing description. All additions, deletions, and modifications to the invention, as disclosed herein, which fall within the meaning and scope of the claims are to be embraced thereby.

What is claimed is:

1. A memory device, comprising:
   a memory array;
   at least one adjustable output driver coupled between the memory array and at least one interface terminal; and
   an output driver calibration circuit configured to adjust an impedance of the at least one adjustable output driver, the output driver calibration circuit including:
   a pull-up calibration circuit including a first comparator configured to compare a reference voltage to a first voltage at a calibration terminal when an external load is connected thereto, the pull-up calibration circuit further comprising a first reconfigurable counter configured to generate a first variable count in response to the comparator and a first variable pull-up impedance circuit responsive to the first variable count, the first variable pull-up impedance coupled to the calibration terminal; and
   a pull-down calibration circuit including a second variable pull-up impedance circuit concurrently responsive to the first variable count and a variable pull-down impedance circuit serially coupled at a reference node to the second variable pull-up impedance circuit, the pull-down calibration circuit further including a second comparator configured to compare the reference voltage to a second voltage at the reference node and a second reconfigurable counter configured to generate a second variable count in response to the second comparator, the variable pull-down impedance circuit responsive to the second variable count.

2. The memory device of claim 1, wherein the pull-up calibration circuit further comprises a first counter filter coupled between the first comparator and the first reconfigurable counter and configured to accumulate from the first comparator prior to generating a change to the first reconfigurable counter.

3. The memory device of claim 1, wherein the pull-up calibration circuit is further configured to generate a pull-up calibrated signal responsive to a steady state of the first comparator.

4. The memory device of claim 3, further comprising a first latch configured to latch the first variable count for configuring an output driver in response to the pull-up calibrated signal.

5. The memory device of claim 1, wherein the pull-down calibration circuit further comprises a second counter filter coupled between the second comparator and the second reconfigurable counter and configured to accumulate from the second comparator prior to generating a change to the second reconfigurable counter.

6. The memory device of claim 1, wherein the pull-down calibration circuit is further configured to generate a pull-down calibrated signal responsive to a steady state of the first and second comparators.

7. The memory device of claim 6, further comprising a second latch configured to latch the second variable count for configuring an output driver in response to the pull-down calibrated signal.

8. A semiconductor wafer comprising a plurality of integrated circuit memory devices, each memory device comprising:
   a memory array;

at least one adjustable output driver coupled between the memory array and at least one interface terminal; and an output driver calibration circuit configured to adjust an impedance of the at least one adjustable output driver, the output driver calibration circuit including:

a pull-up calibration circuit including a first comparator configured to compare a reference voltage to a first voltage at a calibration terminal when an external load is connected thereto, the pull-up calibration circuit further comprising a first reconfigurable counter configured to generate a first variable count in response to the comparator and a first variable pull-up impedance circuit responsive to the first variable count, the first variable pull-up impedance circuit coupled to the calibration terminal; and a pull-down calibration circuit including a second variable pull-up impedance circuit concurrently responsive to the first variable count and a variable pull-down impedance circuit serially coupled at a reference node to the second variable pull-up impedance circuit, the pull-down calibration circuit further including a second comparator configured to compare the reference voltage to a second voltage at the reference node and a second reconfigurable counter configured to generate a second variable count in response to the second comparator, the variable pull-down impedance circuit responsive to the second variable count.

9. An electronic system, comprising:

a processor;

at least one of an input device and an output device operably coupled to the processor; and a memory device operably coupled to the processor, the memory device including a memory array, at least one adjustable output driver coupled between the memory array and at least one interface terminal, the memory device further including an output driver calibration circuit configured to adjust an impedance of the at least one adjustable output driver, the output driver calibration circuit including:

a pull-up calibration circuit including a first comparator configured to compare a reference voltage to a first voltage at a calibration terminal when an external load is connected thereto, the pull-up calibration circuit further comprising a first reconfigurable counter configured to generate a first variable count in response to the comparator and a first variable pull-up impedance circuit responsive to the first variable count, the first variable pull-up impedance circuit coupled to the calibration terminal; and a pull-down calibration circuit including a second variable pull-up impedance circuit concurrently responsive to the first variable count and a variable pull-down impedance circuit serially coupled at a reference node to the second variable pull-up impedance circuit, the pull-down calibration circuit further including a second comparator configured to compare the reference voltage to a second voltage at the reference node and a second reconfigurable counter configured to generate a second variable count in response to the second comparator, the variable pull-down impedance circuit responsive to the second variable count.

10. A method for calibrating an impedance of an adjustable output driver, comprising:

generating a first variable count in response to comparing a reference voltage to a first voltage at a calibration terminal when an external load is connected thereto;

varying an impedance in a first variable pull-up impedance circuit in response to the first variable count;

concurrently varying an impedance in a second variable pull-up impedance circuit in response to the first variable count;

generating a second variable count in response to comparing the reference voltage to a second voltage at a reference node between the second variable pull-up impedance circuit and serially connected to a variable pull-down impedance circuit, wherein at least one of the first and second variable counts includes a reconfigurable increment size in response to a rate of change of a respective at least one of the first and second variable counts;

varying an impedance of the variable pull-down impedance circuit in response to the second variable count;

outputting the first variable count for configuring an output driver when the first variable count achieves a steady state; and outputting the second variable count for further configuring the output driver when the first and the second variable counts achieve steady states.

11. The method of claim 10, further comprising filtering the first variable count to generate a trending of the first variable count.

12. The method of claim 10, further comprising filtering the second variable count to generate a trending of the second variable count.

13. An output driver calibration circuit, comprising:

a pull-up calibration circuit including a first comparator configured to compare a reference voltage to a first voltage at a calibration terminal when an external load is connected thereto, the pull-up calibration circuit further comprising a first reconfigurable counter configured to generate a first variable count in response to the comparator and a first variable pull-up impedance circuit responsive to the first variable count, the first variable pull-up impedance circuit coupled to the calibration terminal; and a pull-down calibration circuit including a second variable pull-up impedance circuit responsive to the first variable count and a variable pull-down impedance circuit serially coupled at a reference node to the second variable pull-up impedance circuit, the pull-down calibration circuit further including a second comparator configured to compare the reference voltage to a second voltage at the reference node and a second reconfigurable counter configured to generate a second variable count in response to the second comparator, the variable pull-down impedance circuit responsive to the second variable count.

14. The output driver calibration circuit of claim 13, wherein at least one of the first and second reconfigurable counters include a reconfigurable increment size in response to a rate of change of a respective at least one of the first and second variable counts.

15. The output driver calibration circuit of claim 13, wherein at least one of the first and second reconfigurable counters include a preset initial count representative of a steady state range of a respective at least one of the first and second variable counts.

16. The output driver calibration circuit of claim 13 wherein the pull-up calibration circuit further comprises a first counter filter coupled between the first comparator and the first reconfigurable counter and configured to accumulate from the first comparator prior to generating a change to the first reconfigurable counter.

17. The output driver calibration circuit of claim 13 wherein the pull-up calibration circuit is further configured to generate a pull-up calibrated signal responsive to a steady state of the first comparator.

18. The output driver calibration circuit of claim 17, further comprising a first latch configured to latch the first variable count for configuring an output driver in response to the pull-up calibrated signal.

19. The output driver calibration circuit of claim 13 wherein the pull-down calibration circuit further comprises a second counter filter coupled between the second comparator and the second reconfigurable counter and configured to accumulate from the second comparator prior to generating a change to the second reconfigurable counter.

20. The output driver calibration circuit of claim 13 wherein the pull-down calibration circuit is further configured to generate a pull-down calibrated signal responsive to a steady state of the first and second comparators.

21. The output driver calibration circuit of claim 20, further comprising a second latch configured to latch the second variable count for configuring an output driver in response to the pull-down calibrated signal.

22. An output driver calibration circuit, comprising:
   a pull-up calibration circuit including a first comparator configured to compare a reference voltage to a first voltage at a calibration terminal when an external load is connected thereto, the pull-up calibration circuit further comprising a first reconfigurable counter configured to generate a first variable count in response to the first comparator and a first extended range variable pull-up impedance circuit responsive to the first variable count, a first variable pull-up impedance coupled to the calibration terminal; and a pull-down calibration circuit including a second extended range variable pull-up impedance circuit responsive to the first variable count and a variable pull-down impedance circuit serially coupled at a reference node to the second variable pull-up impedance circuit, the pull-down calibration circuit further including a second comparator configured to compare the reference voltage to a second voltage at the reference node and a second reconfigurable counter configured to generate a second variable count in response to the second comparator, the variable pull-down impedance circuit responsive to the second variable count, the first and second extended range variable pull-up impedance circuits having a greater impedance range than a variable pull-up impedance circuit in an output driver to be calibrated, wherein at least one of the first and second variable counts includes a reconfigurable increment size in response to a rate of change of a respective at least one of the first and second variable counts.

\* \* \* \* \*